(12) United States Patent
Steinfeld et al.

(10) Patent No.: US 7,129,416 B1
(45) Date of Patent: Oct. 31, 2006

(54) HYBRID GROUND GRID FOR PRINTED CIRCUIT BOARD

(75) Inventors: Robert Steinfeld, Los Gatos, CA (US); Cheung-Wei Lam, San Jose, CA (US)

(73) Assignee: Apple Computer, Inc., Cupertino, CA (US)

( * ) Notice: Subject to any disclaimer, the term of this patent is extended or adjusted under 35 U.S.C. 154(b) by 280 days.

(21) Appl. No.: 10/774,053

(22) Filed: Feb. 5, 2004

(51) Int. Cl.
*H05K 1/03* (2006.01)

(52) U.S. Cl. .................................................. 174/255

(58) Field of Classification Search ............... 174/255, 174/262, 261; 361/805, 795, 799
See application file for complete search history.

(56) References Cited

U.S. PATENT DOCUMENTS 4,899,439 A * 2/1990 Potter et al. .................. 29/846
5,633,479 A * 5/1997 Hirano ......................... 174/255
6,184,477 B1 * 2/2001 Tanahashi .................... 174/261

\* cited by examiner

*Primary Examiner*—Kamand Cuneo
*Assistant Examiner*—Ivan Carpio
(74) *Attorney, Agent, or Firm*—Beyer Weaver & Thomas LLP

(57) ABSTRACT

Electrical mounting boards and methods for their fabrication and use are disclosed herein. In particular, such mounting boards embodiments utilize hybrid ground lines interconnected through a substrate core to form multilayer ground grids. Such hybrid ground lines include groups of substantially parallel ground lines configured such that the groups of ground lines are positioned in transverse arrangement with other groups of ground lines formed on the same level. Such implementations have many uses, including, but not limited to, the ability to more efficiently route signal lines and connect electrical components on a circuit board.

30 Claims, 8 Drawing Sheets

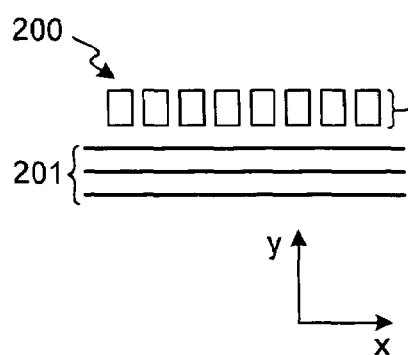
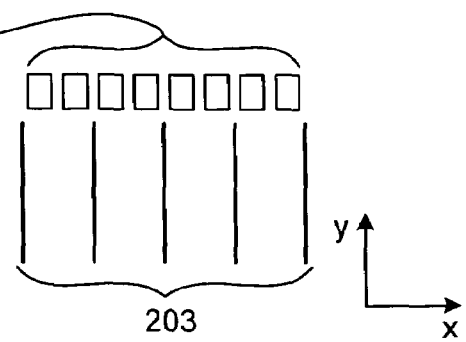
*Fig. 2(a)*  *Fig. 2(b)*

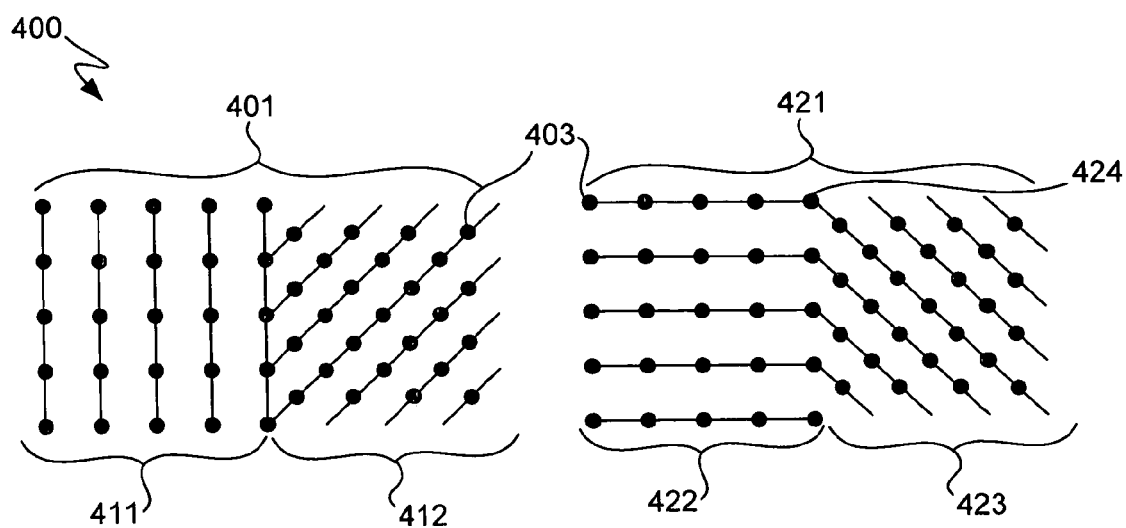
Fig. 4(a)          Fig. 4(b)
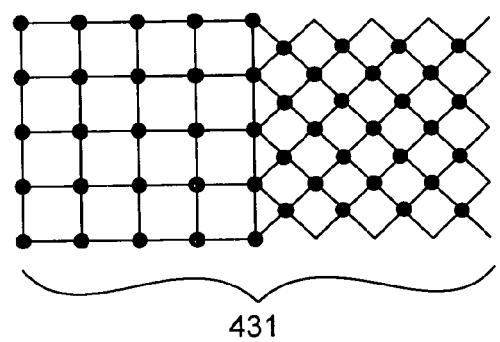
Fig. 4(c)

HYBRID GROUND GRID FOR PRINTED CIRCUIT BOARD

TECHNICAL FIELD

The invention described herein relates generally to printed wiring board layout. In particular, the invention relates to a printed circuit board construction having a hybrid grid network of ground traces formed on two or more layers of the printed circuit board to provide electrical paths capable of reducing Electromagnetic Emissions and improving the Electromagnetic Immunity performance as well as being capable of accommodating a wide range of component arrangements and signal trace configurations.

BACKGROUND

In conventional circuit mounting boards (e.g., printed circuit boards (PCB's)) a ground plane is formed on one or more layers of the board. Such ground planes can be formed on the top or bottom surfaces of boards (especially using basic two layer boards). Also, such ground planes can be formed on interior layers of multi-layer (three or more layers) boards. Such ground planes are satisfactory for certain purposes, but they impose certain significant design limitations. For example, they prohibit the formation of signal traces on the layer containing the ground plane. On a two-layer board this can be a particularly cumbersome design limitation because it effectively prevents circuit structures and electronic components from being formed on or attached to the ground plane layer. This cuts the available board space for such circuitry and components in half.

One conventional approach to solving this problem involves replacing portions of a single layer ground plane with two-layer ground grid. FIGS. 1(a)–1(d) illustrate aspects of this approach. FIG. 1(a) is a side view of a typical two-layer circuit board 100 incorporating a conventional ground grid. The board 100 includes a top surface 101T and a bottom surface 101B separated by a substrate core portion 110. The top and bottom surfaces (101T, 101B) each have a pattern of ground traces formed thereon that are electrically connected by vias passing through the core 110 to form a ground grid. FIG. 1(b) depicts a top plan view of the top surface 101T of the board 100 shown in FIG. 1(a). It is to be emphasized that the depicted illustration depicts an exaggerated implementation of a conventional ground grid. Commonly, such ground grids are implemented on only small portions of a circuit board. Returning to FIG. 1(b), a pattern of ground traces 102 is formed on the surface 101T. The ground traces 102 are configured in a substantially parallel arrangement so that all the ground traces 102 are parallel to one another. Such a configuration can be referred to as a "Y"-axis board configuration. Vias 103 are formed in the surface 101T to penetrate through the core 110 and which are filled with an electrically conductive material (e.g., copper) to effect electrical connection with another set of ground traces formed on the bottom surface 101B of the board 100.

FIG. 1(c) depicts a bottom plan view of the bottom surface 101B of the board 100 shown in FIG. 1(a). A pattern of ground traces 104 (depicted by the alternating dotted dashed lines) is formed on the surface 101B. The inventors point out that said alternating dotted dashed lines are intended to represent unbroken electrical paths (being specifically intended to differentiate from the straight (unbroken) lines 102 of FIG. 1(b)). The ground traces 104 of the bottom surface 101B are configured in a substantially parallel arrangement with all of the ground traces 104 of the bottom surface 101B. Such a configuration can be referred to as an "X"-axis board configuration. The vias 103 have openings in the surface 101B to facilitate electrical connection with the ground traces 103 of the top surface 101T of the board 100. The connection of the top ground traces 102 with the bottom ground traces 104 forms a unified ground grid that leaves room on both the top and bottom surfaces for the formation of signal traces and electronic component attachment contacts.

Importantly for the conventional approach disclosed in the foregoing Figures is the orientation of the top ground traces 103 with the bottom ground traces 104. These conventional approaches are limited to all ground traces (e.g., 102, 104) being parallel to all of the other ground traces on the same level. Additionally, the top and bottom ground traces are configured so that they are perpendicular to one another. Reference is made to the figurative illustration FIG. 1(d) which schematically depicts a conventional ground grid arrangement. FIG. 1(d) is a representation intended to capture the relationship between the ground traces 102 of the top layer and the ground traces 104 (depicted by dotted and dashed lines) of the bottom layer connected through the vias 103. The interconnection of the top ground traces 102 and the bottom ground traces 104 at the vias (tie points) 103 form a plurality of generally square ground structures 105 that are used to provide electrical ground return paths, devices, and components as needed.

One significant drawback to the configuration depicted in FIG. 1 is that when all ground traces on a level are formed parallel to each other they impose significant restrictions on the configuration of any signal traces formed on the same level. This is especially troublesome on two-level boards which cannot rely on the use of levels without ground grids to circumvent the restrictions imposed by the ground grids. The same problem also exists on multi-level boards having three or more layers, but under certain circumstances the difficulties can be more easily alleviated.

FIGS. 2(a) and 2(b) can be used to illustrate one example of the problem. FIG. 2(a) schematically illustrates a circuit board configuration 200 formed on a level of a circuit board. An "X" configured pattern of ground lines 201 is depicted on a level of the board. Also, a set of contacts 202 (perhaps associated with a specific device or components) is formed on the same level of the board. As can be seen, the placement of the ground lines 201 significantly impedes the formation of signal traces to and from the contacts 202. For example, signal traces cannot be formed extending in the "y" axis direction because they would cross the "X"-axis oriented ground lines 201. Additionally, signal traces cannot easily be formed extending in the "x"-axis direction because they would cross over other contacts 202. In comparison, FIG. 2(b) presents a contrasting orientation. FIG. 2(b) shows the orientation of the same set of contacts 202 but the ground lines 203 are configured in a "Y"-axis oriented configuration. Such an arrangement easily permits the formation of signal traces (which extend in the "y"-axis direction) which can be electrically connected to the set of contacts 202. In some cases, the designer can simply reorient the contacts to accommodate the ground grid. However, in many cases, a designer cannot simply reorient the contacts to accommodate the ground grid. Designers are frequently constrained by space, design, electrical, as well as many other considerations that prevent signal traces from being routed in a manner that most ideally suits the orientation of the ground grid.

In such cases, it would be advantageous to create a ground grid that can accommodate a wider range of signal trace design configurations. Thus, there is a need for ground grid embodiments that can accommodate a wider range of signal trace configurations as well as a wider range of electronic component orientations while still achieving a reasonable level grounding in a electronic mounting board.

SUMMARY OF THE INVENTION

In accordance with the principles of the present invention, an improved electrical mounting board and methods for its fabrication and use are disclosed. In particular such improved boards utilize hybrid ground lines interconnected to form multilayer ground grids. Such implementations have many uses, including, but not limited to, the ability to more efficiently route signal lines and connect electrical components on a circuit board to ground line electrical paths.

One embodiment of the invention comprises an electrical mounting board having substrate with a plurality layers configured such that a substrate core lies between the layers. A first layer has a plurality of bi-directionally oriented electrical ground traces arranged thereon in a hybrid configuration. On the first layer, a first group of electrical ground traces is arranged in a transverse relationship with a second group of electrical ground traces. A second layer has a plurality of bi-directionally oriented electrical ground traces arranged in a hybrid configuration formed thereon. The second layer includes a third group of electrical ground traces arranged in a transverse relationship with a fourth group of electrical ground traces. A set of electrically conductive interconnects passes through the substrate core electrically connecting the ground traces of the first layer those of the second layer to form a multi-layer ground grid having a plurality of ringlets. Electrical contacts and signal traces are formed between the electrical ground traces of at least one of the first and second layers.

An embodiment of the invention comprises an electrical mounting board having a substrate with a plurality layers configured such that a substrate core lies between the layers. A first layer includes a plurality of electrical ground traces configured in at least two groups arranged in a hybrid configuration so that a first group of substantially parallel electrical ground traces is arranged in a transverse relationship with a second group of substantially parallel electrical ground traces. A complementary a second layer includes a plurality of electrical ground traces configured in at least two groups arranged in a hybrid configuration so that a third group of substantially parallel electrical ground traces is arranged in a transverse relationship with a fourth group of substantially parallel electrical ground traces. A set of conductive interconnects passes through the substrate core to electrically connect electrical ground traces of the first layer with electrical ground traces of the second layer to form a multi-layer ground grid having a plurality of ringlets. Signal traces are formed on at least one of the first and second layers.

Another embodiment of the invention includes a method of configuring a circuit layout for an electrical mounting board. Such method involves providing a substrate with at least a first layer and a second layer separated by a substrate core layer. A pattern of signal traces on the first layer is formed as is pattern of electronic component arrangements associated with the first layer. A plurality of conductive electrical ground traces is formed on the first layer of the substrate. The traces of the first layer being formed in at least two groups arranged in a hybrid configuration so that a first group of substantially parallel electrical ground traces is arranged in a transverse relationship with a second group of substantially parallel electrical ground traces, the lengths and positions of the ground traces being arranged to accommodate the pattern of signal traces formed on the first layer and arranged to accommodate the pattern of electronic component arrangements associated with the first layer. A pattern of signal traces is formed on the second layer as is a pattern of electronic component arrangements associated with the second layer. A plurality of conductive electrical ground traces is formed on the second layer of the substrate, the traces of the second layer being configured in at least two groups arranged in a hybrid configuration so that a third group of substantially parallel conductive electrical ground traces is arranged in a transverse relationship with a fourth group of substantially parallel conductive electrical ground traces, the lengths and positions of the ground traces being arranged to accommodate the pattern of signal traces formed on the second layer and arranged to accommodate the pattern of electronic component arrangements associated with the second layer. A set of electrically conductive interconnects is formed to pass through the substrate core hereby electrically connecting electrical ground traces of the first layer with electrical ground traces of the second layer to form a multi-layer ground grid having a plurality of ringlets.

Other aspects and advantages of the invention will become apparent from the following detailed description and accompanying drawings which illustrate, by way of example, the principles of the invention.

BRIEF DESCRIPTION OF THE DRAWINGS

The following detailed description will be more readily understood in conjunction with the accompanying drawings, in which:

FIGS. 2(a)–2(b) are simplified schematic depictions of conventional PCB's that illustrate some of the problems encountered when a convention ground grid as is used to mount electronic components.

FIGS. 4(a)–4(c) are simplified schematic depictions of another hybrid ground grid embodiment constructed in accordance with the principles of the invention.

It is to be understood that in the drawings like reference numerals designate like structural elements. Also, it is understood that the depictions in the Figures are not necessarily to scale.

DETAILED DESCRIPTION OF THE INVENTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In the following detailed description, electrical circuit board embodiments will be disclosed. In particular, the depicted structures depict embodiments having hybrid ground layers integrated together to form suitable ground grid that can be electrically connected with circuits, components, and devices of the circuit board. Such embodiments provide improved circuit routing capability for signal traces as well as improved flexibility for the placement and orientation of electronic components used with the embodiments. Additionally, some embodiments can be configured to provide circuit paths having source (signal) paths with substantially the same electrical path length as those for associated signal return paths. In such configuration printed wiring layouts can be used to reduce the signal and return loop area.

Figure 1A:
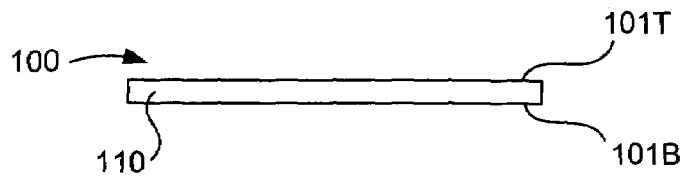
FIGS. 1(a)–1(d) are simplified schematic depictions of a conventional printed circuit board (PCB) having a convention ground gird as is used to mount electronic components.
Figure 1B:
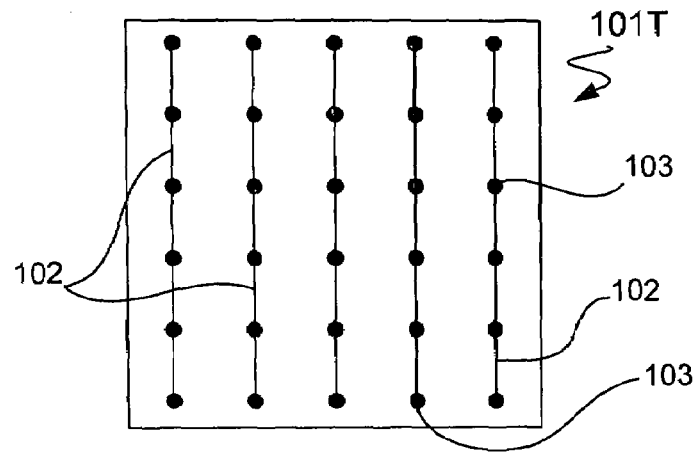
Figure 1C:
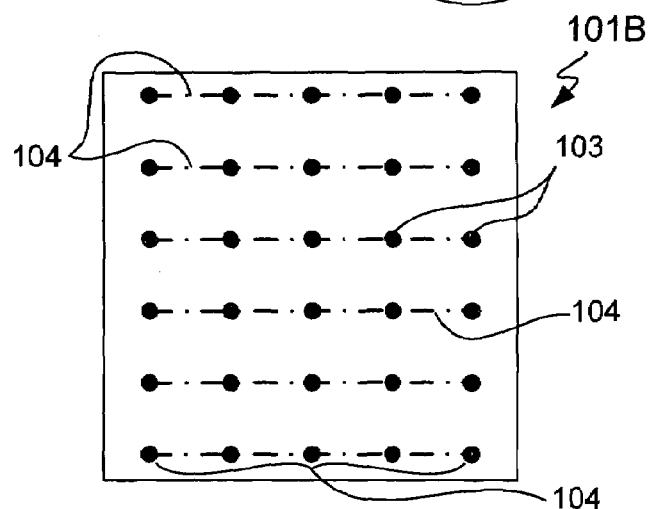
Figure 1D:
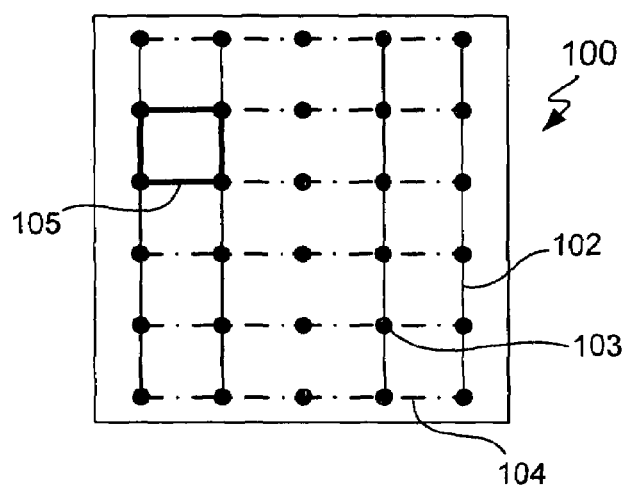
Figure 3A:
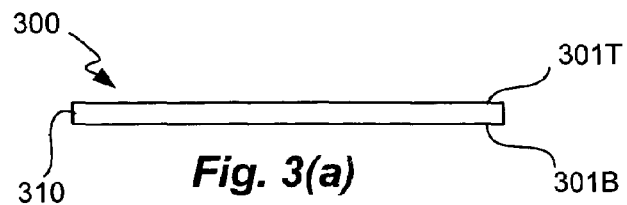
FIGS. 3(a)–3(f) are simplified schematic depictions of a hybrid ground grid embodiment constructed in accordance with the principles of the invention.

FIG. 3(a) is a side view of a typical two-layer circuit board embodiment incorporating a ground grid constructed in accordance with the principles of the invention. The patentee's point out that the depicted embodiment is for illustration purposes only and is not intended to limit the scope of the invention. The depicted embodiment is merely a particularization used to facilitate a discussion of some of the more general features that make up the invention. As stated, FIG. 3(a) depicts a side view of an embodiment of an electrical circuit board 300 constructed in accordance with the principles of the invention. The board 300 includes a top surface 301T and a bottom surface 301B separated by a substrate core portion 310. Most commonly, the core 310 is formed of fiber material suspended in a cured BT (bismaleimide triazine) resin material. However, as is known to persons having ordinary skill in the art, many other alternative materials can be used to construct suitable boards 300.

The top and bottom surfaces (301T, 301B) each have a pattern of hybrid traces formed thereon that are electrically connected by vias passing through the core 310 to form a ground grid.

Figure 3B:
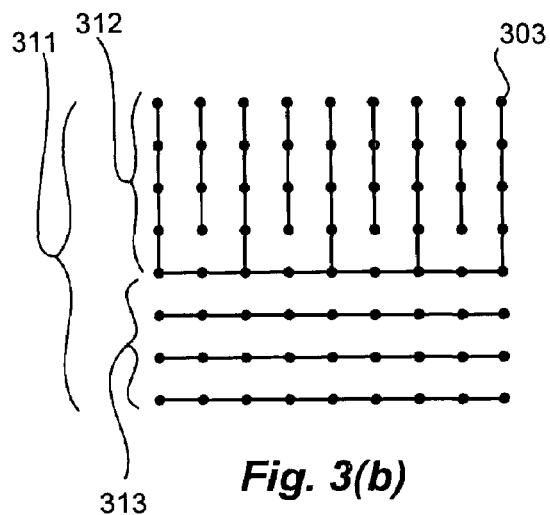

FIG. 3(b) depicts a top plan view of the top surface 301T of the board 300 shown in FIG. 3(a). A pattern of hybrid traces 311 is formed on the surface 301T. These traces are used to electrically establish return paths for electrical circuitry formed on or connected to the board 300. Additionally, these traces are used to establish ground connections. For this reason these traces are referred to herein as return traces or alternatively ground traces. Hybrid ground traces are configured such that at least some of the ground traces (formed on a level of the board) are oriented in a different direction from other ground traces formed on the same level of the board. In FIG. 3(b) the hybrid ground traces 311 are configured having at least two groups 312, 313 of ground traces, each being oriented in a different direction.

Still referring to FIG. 3(b), the first layer 301T of the board 300 has formed thereon a set of bi-directionally oriented electrical ground traces 311 arranged in a hybrid configuration so that a first group 312 of electrical ground traces is arranged in a transverse relationship with a second group 313 of electrical ground traces. In the depicted configuration, the first group 312 of electrical ground traces is arranged so that all the ground traces in the group 312 are substantially parallel to each other. The depicted group 312 is in the so-called "Y"-axis configuration. The second group 313 of electrical ground traces is arranged so that all the ground traces in the group 313 are substantially parallel to each other. The depicted group 313 is in the so-called "X"-axis configuration. The first group 312 is shown as being electrically connected with the second group 313 in some places. However, this need not be the case. The ground traces are typically formed of a conductive material (e.g., copper). As used herein, transverse is intended to mean that the orientation of the traces of at least one group (e.g., the first group 312) is not parallel to the orientation of at least one other group of traces (e.g., the second group 313) as shown, for example in FIG. 3(b). Additionally, the inventors contemplate configurations having more than two groups of ground traces formed on the same layer. Such groups satisfy the principles of the invention as long as at least one group of ground traces is oriented transversely with respect to at least one other group of traces. Additionally, the inventors contemplate configurations having more than one "ground" on the same layer. For example: signal ground, chassis ground, audio ground, and the like. Moreover, more than one independently grounded ground grid can be formed on the same circuit board if desired. Finally, although the two depicted groups 312, 313 of transversely oriented ground traces are oriented in a perpendicular relationship to each other they are not required to be perpendicular.

Vias 303 are formed in the surface 301T to penetrate through the core 310 to facilitate electrical connection with another set of electrical ground traces 321 formed on another level of the board 300. The vias 303 are filled with an electrically conductive material (e.g., copper) to facilitate electrical connection with the other set 321 of ground traces formed, for example, on the bottom surface 301B of the board 300.

Figure 3C:
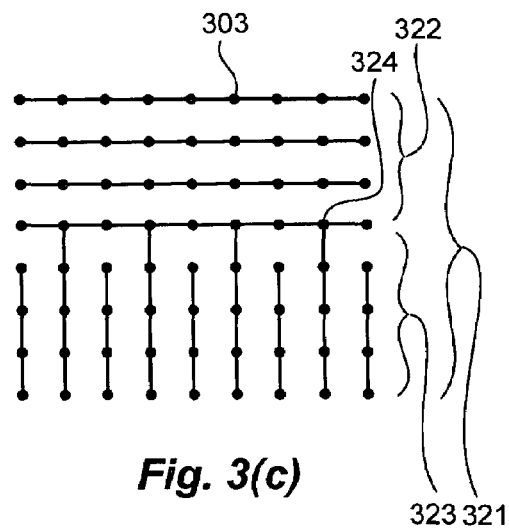

FIG. 3(c) depicts a second set 321 of bi-directionally oriented electrical ground traces formed on a level 301B of the board 300 and arranged in a hybrid configuration so that one group 322 of electrical ground traces is arranged in a transverse relationship with a another group 323 of electrical ground traces formed on the same level. Again, one group 322 of electrical ground traces is arranged so that all the ground traces in the group 322 are substantially parallel to each other. The depicted group 322 is in the so-called "X"-axis configuration. The other group 323 of electrical ground traces is arranged so that all the ground traces in the group 323 are substantially parallel to each other and oriented in the so-called "Y"-axis configuration. Additionally, the two groups 322, 323 can optionally be electrically connected with each other on level 301B. One such connection is depicted by connection point 324.

As indicated above, most commonly, the core 310 is formed of fiber material suspended in a cured BT (bismaleimide triazine) resin material. Such a material is merely an example of one suitable approach. As is known to those of ordinary skill, many other substrate materials can be employed to form substrate in accordance with the principles of the invention. Such a substrate core can comprise one of many layers in a multi-layer electrical circuit board. Typically, this core 310 is then treated to form metallization layers. Commonly, copper materials or coated copper materials are used. Other conductive materials are also used. A solder mask layer is then typically formed over the metallization layers and photolithographically patterned to create a solder mask that defines a corresponding pattern in the metallization layers. Examples of resulting patterns are depicted in FIG. 3(b) (e.g., 311) and FIG. 3(c) (e.g., 321). The reader is reminded that such examples are for illustration purposed only and are not intended to limit the full breadth of patterns covered by the invention. The inventors contemplate that those of ordinary skill in the art can employ the teachings set forth herein to generate a wide range of suitable patterns. Typically, such substrate cores 310 are commonly very thin, on the order of about 0.50–0.60 mm thick, although other thicknesses can be employed by the user. Additionally, electrical connections can be attached to a backside (or front side) surface of the substrate (e.g., surface 301B) to facilitate the physical and electrical connection of the board 300 to a system board (e.g., a motherboard). The methods of constructing such substrates 300 are well known to those having ordinary skill in the art.

Figure 3D:
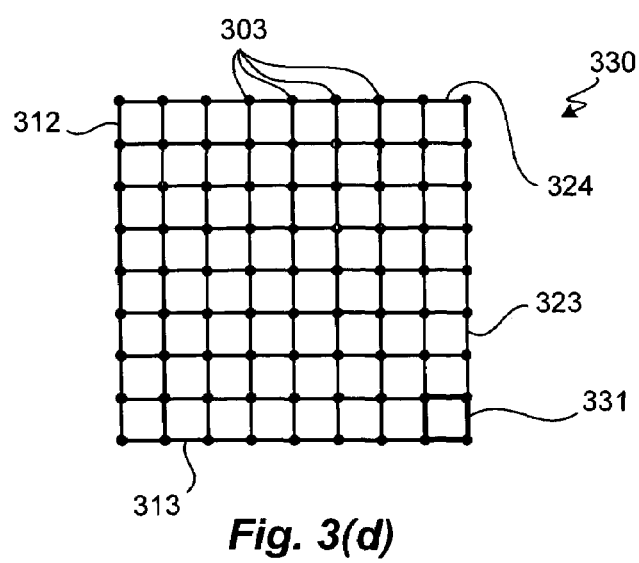

FIG. 3(d) is a simplified top down schematic view depicting the electrical interconnections 303 between the bi-directionally oriented electrical ground traces (312, 313) formed on the top level 301T and the bi-directionally oriented electrical ground traces (322, 323) formed on the bottom level 301B to form a multi-level ground grid 330 configured to form plurality of ground "ringlets" 331. Such ringlets 331 refer to a series of electrically contiguous conduction paths (conduction loops) that make up the ground grid 330.

Figure 3E:
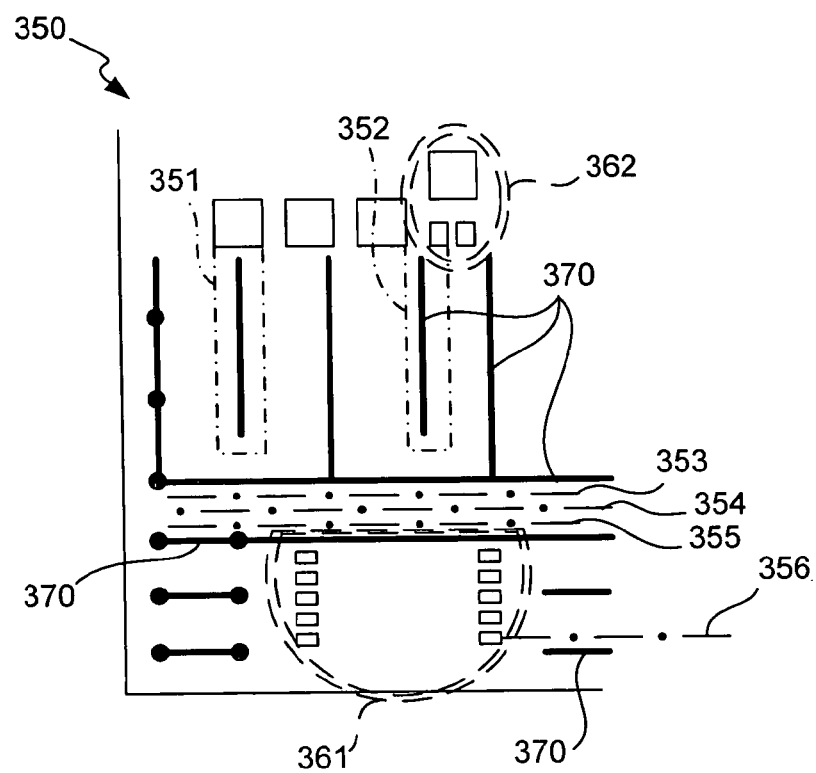

FIG. 3(e) is a simplified top down schematic view depicting a portion of a layer similar to that shown in FIG. 3(b). This depiction includes many hybrid ground traces 370 and includes many signal traces (some of which are depicted here in alternating dashed/dotted lines) 351–356 and electronic component mounting sites (some of which are circumscribed here in alternating double dashed lines) 361, 362. The positioning and arrangements of the ground traces 370 and the signal traces (351–356) as well as electronic component mounting sites (361, 362) can be considered together. Each of the embodiments depicted herein typically include such ground traces, signal traces, and electronic component mounting sites.

Figure 3F:
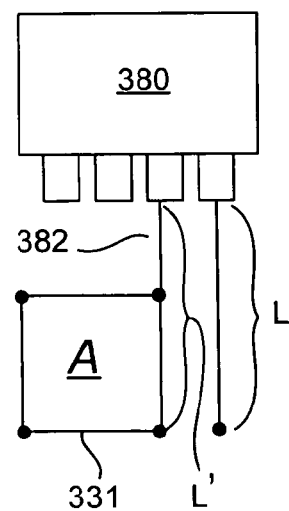

FIG. 3(f) is a simplified depiction of one embodiment of the invention wherein an electronic component 380 is electrically connected with a source line 381 providing a signal into the component. Typically, the source line 381 comprises a signal trace formed on a layer (or layers) of the board. Also, the component includes an associated signal return line 382. Moreover, in some implementations the signal (source) line 381 is configured so that it is close to (adjacent) to a ringlet 331 forming part of the grid. This contributes to the formation of small loop areas (said loop defined by a current path including, for example, a signal path between electronic components and the corresponding return or ground path for those components). This close physical association can help to reduce EMC problems. Additionally, as is readily appreciated by those having ordinary skill in the art, in a conventional circuit board having ground plane, when current passes through signal line connected with a component or device a return current path is formed in the ground plane which passes directly underneath (or overhead) the signal line. Thus, in a conventional configuration, the signal and return current propagation paths are substantially mirror images of each other. This condition of mirror image signal and return paths may not always be possible when a ground grid of the present invention is employed. However, by constructing a ground grid having a densely packed pattern of very small ringlets it is possible to construct a return path that very nearly matches that of the signal path. Thus, by forming a tightly packed arrangement of very small ringlets, small loop area return electrical paths can be formed. The inventors contemplate that larger ringlets can be used, but this is achieved at the cost of reduced EMC performance for the larger loop areas of the board.

The inventors specifically point out that the embodiment of FIG. 3(f) is depicted on the top surface of a circuit board. Other embodiments of the invention can use three-dimensional implementations to generate source lines and their associated return lines in a three-dimensional configuration.

In one implementation a ringlet 331 comprises a portion of a ground grid such as described elsewhere herein. Each ringlet 331 defines an area A. In some embodiments, this area A is reduced to a minimum possible area to optimize electromagnetic compatibility (EMC) performance of the ground grid. By minimizing the grid "patch" (i.e., minimizing the grid ringlet areas A) EMC performance can be optimized. Additionally, in some embodiments, a ratio of about 10 (or fewer) signal lines to each associated ringlet 331 is preferred. Thus, the use of a hybrid ground grid allows a user to implement a denser ground grid and hence better EMC (Electromagnetic Compatibility) performance. Implementations of hybrid ground grids constructed in accordance with the principles of the invention can also vary in the size of the ringlets in different areas of a circuit board layout. For example, in areas having a high component and/or signal line density, larger ringlets could be used to accommodate component and signal line placement. Whereas in other portions of the board, denser patterns of smaller ringlet size can be used to accommodate a minimum ringlet dimension. Such configurations can "have the best of both worlds" as it were having both improved areas for components and signal lines as well as availability of improved return paths due to the presence of densely packed small ringlets.

FIG. 4(a) depicts another bi-directional ground gird approach. FIG. 4(a) shows a top plan view of a top surface 400 which can be implemented with a board. For example, it could be used in place of 301T of board 300 in FIG. 3(a). FIG. 4(a) depicts another pattern of hybrid ground traces 401 that can be formed on the surface 301T. Again, the hybrid ground traces are configured such that at least some of the ground traces (formed on a level of the board) are oriented in a different direction from other ground traces formed on the same level of the board. The hybrid ground traces 401 of FIG. 4(a) are configured having at least two groups 411, 412 of ground traces, each being oriented in different directions.

Still referring to FIG. 4(a), the hybrid ground traces 401 are arranged in a hybrid configuration so that a first group 411 of electrical ground traces is arranged in a transverse relationship with a second group 412 of electrical ground traces. In the depicted configuration, the first group 411 of electrical ground traces is arranged so that all the ground traces in the group 411 are substantially parallel to each other. The depicted group 411 is in the so-called "Y"-axis configuration. The second group 412 of electrical ground traces is arranged so that all the ground traces in the group 412 are substantially parallel to each other. The depicted group 412 is in a diagonal configuration. Again, the first group 411 can optionally be electrically connected with the second group 412 in some places. The depicted ground traces are typically formed of a conductive material (e.g., copper). Again, transverse is intended to mean that the orientation of the traces of at least one group (e.g., the first group 411) is not parallel to the orientation of at least one other group of traces (e.g., the second group 412) as shown, for example in FIG. 4(a). As before, the inventors contemplate configurations having more than two groups of ground traces formed on the same layer. Such groups satisfy the principles of the invention as long as at least one group of ground traces is oriented transversely with respect to at least one other group of traces.

Vias 403 are formed in the surface of the substrate and penetrate through the core to facilitate electrical connection with another set of electrical ground traces 421 formed on another level of the board. The vias 403 are filled with an electrically conductive material (e.g., copper) to facilitate electrical connection with another set 421 of ground traces formed, for example, on another surface of the board (e.g., the bottom surface 301B of the board 300).

FIG. 4(b) depicts a second set 421 of bi-directionally oriented electrical ground traces that is complementary to the first set 401. This second set 421 can be formed, for example, on a level 301B of the board 300. Again, the second set 421 is also arranged in a hybrid configuration so that one group 422 of electrical ground traces is arranged in a transverse relationship with a another group 423 of electrical ground traces formed on the same level. Again, one group 422 of electrical ground traces is arranged so that all the ground traces in the group 422 are substantially parallel to each other. The depicted group 422 is in the so-called "X"-axis configuration. The other group 423 of electrical ground traces is arranged so that all the ground traces in the group 423 are substantially parallel to each other and oriented in a diagonal configuration that is transverse with the diagonal configuration of the set 412 in FIG. 4(a). Additionally, the two groups 422, 423 can optionally be electrically connected with each other as depicted, for example, by connection point 424.

The two structures indicated in FIGS. 4(a) and 4(b) can be integrated into a ground grid such as that depicted in FIG. 4(c). Electrical interconnections between the first set 401 and the second set 421 are typically established using vias 403 that can be filled with electrically conductive material to form a multi-layer ground grid 431, which is schematically depicted in FIG. 4(c).

As should be apparent to those having ordinary skill in the art, a pattern of hybrid ground traces can include more than two groups of ground traces. Such multi-directionally oriented hybrid ground traces can accommodate a wide range of different signal traces patterns as well as many different component and device orientations. The following figures provide one illustration of a much wider concept.

Figure 5A:
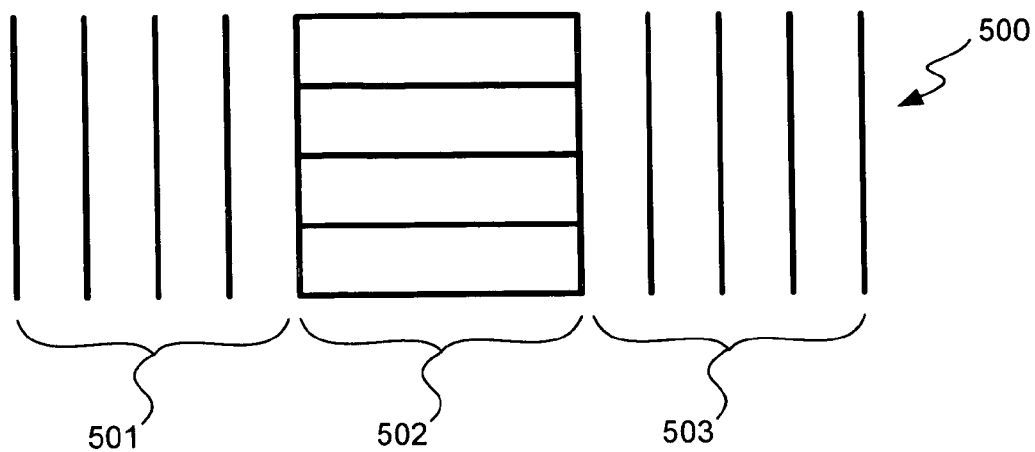
FIGS. 5(a)–5(c) are simplified schematic depictions of another approach for establishing a hybrid ground grid embodiment constructed in accordance with the principles of the invention.
Figure 5B:
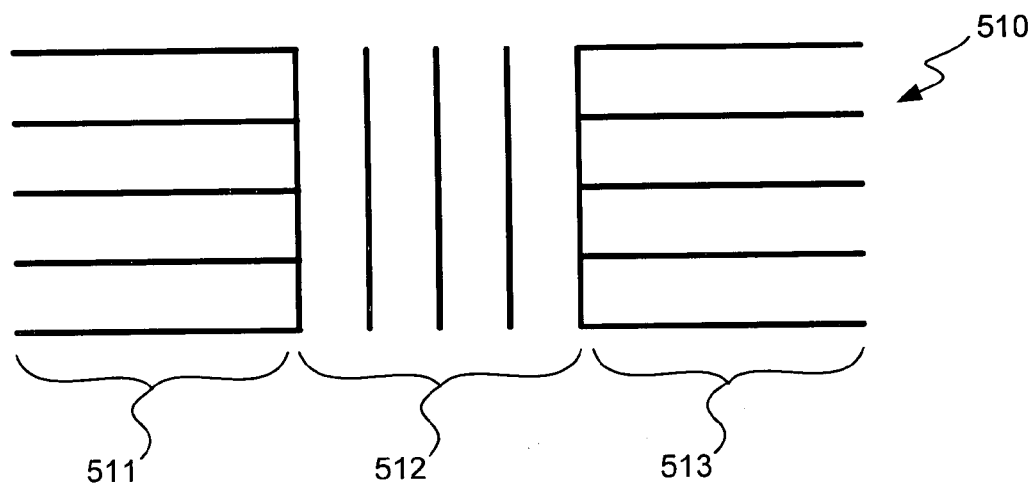
Figure 5C:
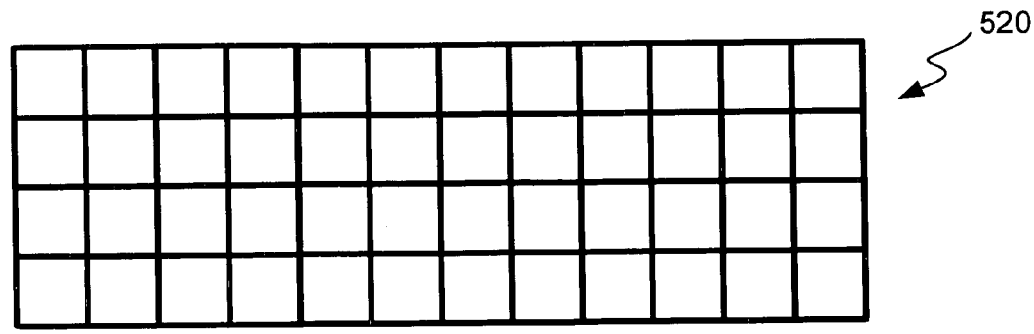

For example, reference is hereby made to FIGS. 5(a)–5(c), wherein one implementation of a multi-directionally oriented ground grid is illustrated. In FIG. 5(a), a multi-directionally oriented pattern of hybrid ground traces 500 is shown as being formed on a surface (e.g., surface 301T of FIG. 3(a)). The inventors also contemplate that the depicted pattern of hybrid ground traces 500 can be formed on several layers rather than just one. The depicted ground traces are configured such that the ground traces are oriented in a different direction from other ground traces formed on the same level of the board. In FIG. 5(a) the hybrid ground traces 500 are shown having three groups 501, 502, 503 of ground traces (although more are contemplated as being within the scope of the invention), each being oriented in a different direction than the adjacent groups (e.g., group 502 is oriented transversely to groups 501, 503). Although not shown in this view, vias can be used to electrically interconnect the depicted ground traces 500 with those on other levels of a substrate. Such connection is similar to connections described elsewhere in this patent.

FIG. 5(b) depicts a complementary pattern of hybrid ground traces 510 (also multi-directionally oriented) formed on at least one other surface (e.g., surface 301B of FIG. 3(a)). In FIG. 5(b) the hybrid ground traces 510 are shown having three groups 511, 512, 513 of ground traces (although embodiments including more groups of ground traces are contemplated as being within the scope of the invention), each being oriented in a different direction than the adjacent groups (e.g., group 512 is oriented transversely to groups 511, 513). These ground traces 511, 512, 513 are complementary to the first three groups 501, 502, 503 of ground traces. Being complementary means that when one set of ground traces is interconnected with a complementary set of ground traces, a ground grid can be formed. As previously explained, electrical connections are formed to interconnect the ground traces 500 with ground traces 510 to form a multi-level ground grid. One such grid 520 is presented in simplified abstract plan view in FIG. 5(c).

Figure 6:
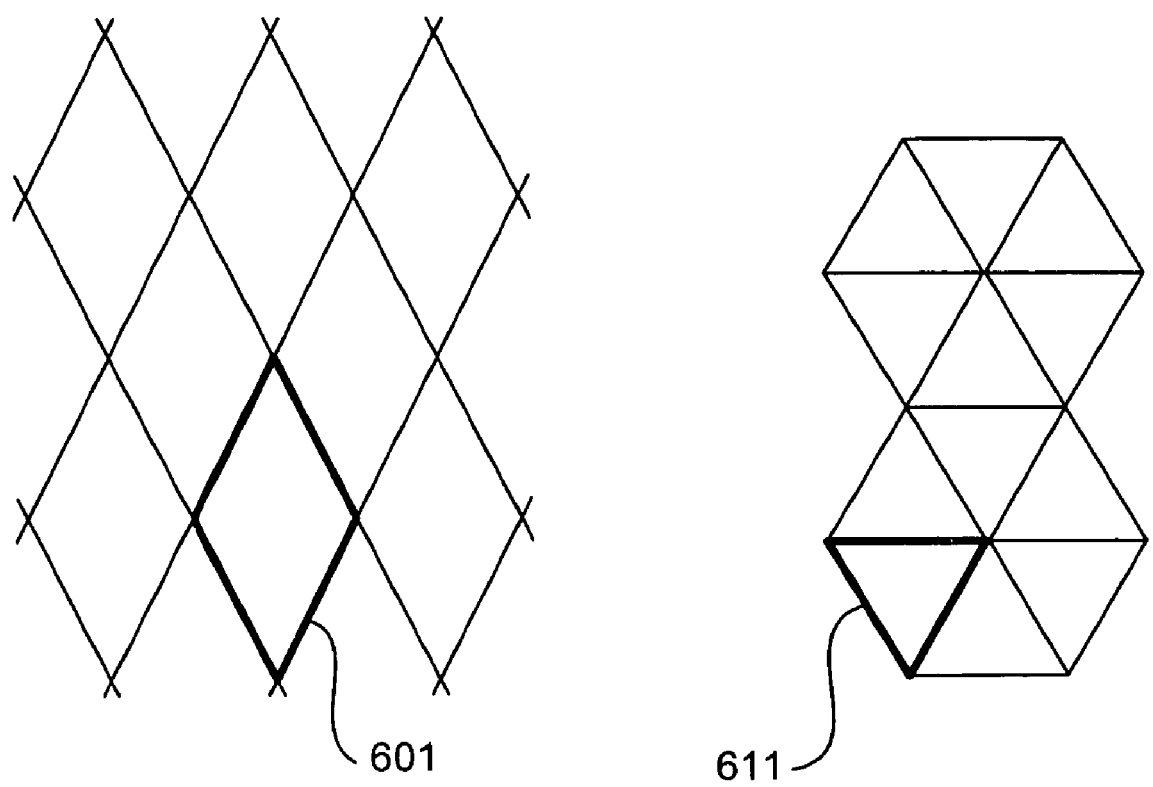
FIG. 6 provides some simplified illustrations of a ground grid structure constructed in accordance with the principles of the invention.

As explained previously (e.g., with respect to FIG. 3(d)) the ringlets used in a ground grid are generally configured as "squares" (105, 331). As can be appreciated by those of ordinary skill in the art, other ringlet configurations can be employed. Referring to FIG. 6, several examples of alternative ringlet embodiments are shown. For example, a diamond-shaped ringlet 601 is depicted. As is a triangularly shaped ringlet 611. As can readily be appreciated by persons having ordinary skill in the art, other ringlet configurations can be employed as needed by the designer.

A multi-layer ground grid constructed in accordance with the principles of the invention can be particularly useful when employed to control electromagnetic emissions and immunity in certain electromagnetic field (EMF) sensitive devices. Examples, includes sensors and controlled capacitive devices. Such devices can be significantly affected by the presence of a large conductive ground plane. Replacing the plane with a ground grid structure can provide a significant reduction in the undesirable electromagnetic emission (e.g., reducing the overall effect of plane capacitances).

Figure 7:
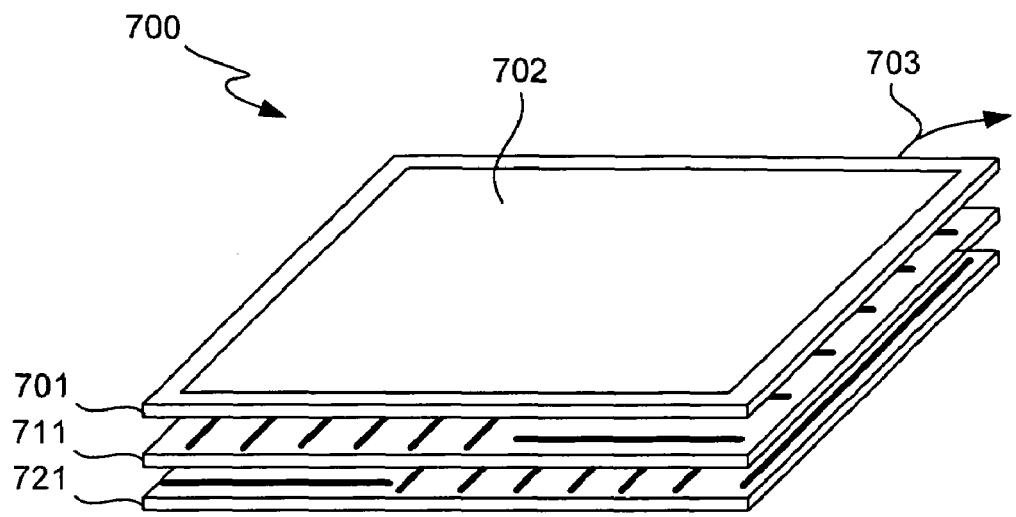
FIG. 7 is a simplified schematic depiction of a track pad implementation incorporating a ground grid constructed in accordance with the principles of the invention.

FIG. 7 is a simplified schematic depiction of one such EMF sensitive device 700. Three substrate layers (701, 711, 721) are depicted in exploded view for easier reference. A top layer 701 has track pad 702 formed on its top surface. As is known to persons having ordinary skill in the art, a track pad 702 is an electronic device configured to track the movement of an object over the surface of the track pad 702. In one common implementation, the motion of a finger can be tracked as it is moved over the surface of the track pad 702. The finger cases changes in the EMF which are sensed by the track pad 702 and translated into signals that can be used to track the motion of a finger as it is moved over the pad 702. Such an implementation can be used in place of a standard mouse with the signal from the track pad 702 being communicated 703 to a computer or other related device. In one implementation, the movement of the finger is tracked by measuring changes in capacitance over the surface of the track pad 702, said changes being translated into a suitable electronic signal by the electronic circuitry of the track pad 702. The presence of a solid ground plane under (or near) the track pad can seriously affect the capacitance of the track pad 702 thereby degrading its performance. By implementing a ground grid in place of a solid ground plane, this problem can be significantly ameliorated while still providing suitable grounding (and return paths) for the circuitry and components connected with the circuit board. In the depicted example, a first set of ground traces (comprising two groups of ground traces 712, 713) is formed on a substrate layer 711. Another second set of ground traces (comprising two groups of ground traces 722, 723) is formed on another substrate layer 721 and electrically connected with the first layer 712, 713 to form a ground grid. Commonly, the second set of ground traces (722, 723) is formed on a back side of the layer 711. However, for ease of illustration, the second set of ground traces (722, 723) is shown as being formed on another substrate layer 721. Taken with the teachings provided herein, many other implementations suggest themselves to those having ordinary skill in the art.

Figure 8:
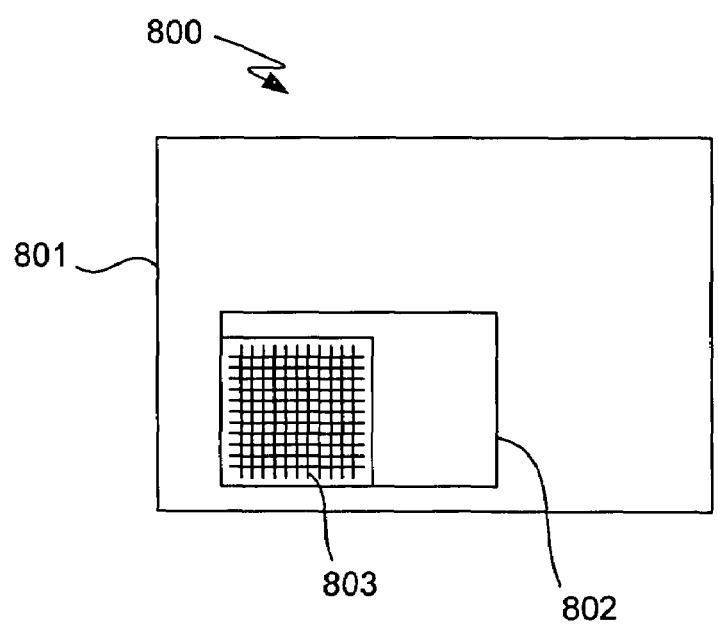
FIG. 8 is a simplified illustration of an electronic device that can incorporate hybrid ground grid arrangements and substrates constructed in accordance with the principles of the invention.

FIG. 8 depicts a more generalized embodiment 800 of the principles of the invention. The embodiment 800 includes a device 801 (e.g., a computer, a PDA, or many other types of electronic devices and components) having mounted therein an electronic circuit board 802 that incorporates a hybrid ground grid 803 of the type discussed extensively herein.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. In particular, it is contemplated by the inventors that embodiments of the invention can be incorporated into a number of electronic devices including, but not limited to, computers, PDA's, and wide range of other consumer or commercial electronic devices. Although only a few embodiments are expressly disclosed herein, it should be appreciated by anyone having ordinary skill in the art that, using the teachings disclosed herein, many different PCB hybrid ground grid configurations can be implemented and still fall within the scope of the claims. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. An electrical mounting board comprising:
a substrate having a plurality layers configured such that a substrate core lies between the layers;
a first layer having formed thereon a plurality of bi-directionally oriented electrical ground traces arranged in a hybrid configuration so that a first group of electrical ground traces is arranged in a transverse relationship with a second group of electrical ground traces and wherein the first layer includes longitudinal spaces between the ground traces enabling signal traces to be formed thereon;
a second layer having formed thereon a plurality of bi-directionally oriented electrical ground traces arranged in a hybrid configuration so that a third group of electrical ground traces is arranged in a transverse relationship with a fourth group of electrical ground traces and wherein the second layer includes longitudinal spaces between the ground traces enabling signal traces to be formed thereon;
a set of electrically conductive interconnects that pass through the substrate core to electrically connect electrical ground traces of the first layer with electrical ground traces of the second layer to form a multi-layer ground grid having a plurality of ringlets; and
signal traces formed on the longitudinal spaces between the electrical ground traces of at least one of the first and second layers.

2. An electronic device incorporating the board of claim 1.

3. The board of claim 1 wherein the electrical board comprises a two layer board wherein the first layer comprises a top layer of the board and wherein the second layer comprises a bottom layer of the board.

4. The board of claim 1 wherein the electrical board comprises a board having at least three layers.

5. The board of claim 1 wherein electronic components are mounted on the board and electrically connected with the signal traces.

6. The board of claim 5 wherein electrical signal is provided to an electronic component using a signal trace;
wherein the electronic component is electrically connected with an associated ringlet; and
wherein the signal trace is configured so that it is positioned near the associated ringlet.

7. The board of claim 6 wherein an electrical current path defined by the signal trace and a return path through an associated ringlet is configured to minimize the loop area defined by the electrical current path.

8. The board of claim 1 wherein the plurality of electrical ground traces of the first layer overlay the plurality of electrical ground traces of the second layer to form a multi-layer grid having a plurality of ringlets configured such that the density of the ringlets is related to one of the anticipated or measured electromagnetic noise of circuitry and electrical components mounted on the board.

9. The board of claim 1 wherein the ringlets are formed having different sizes at different areas of the board.

10. The board of claim 1 wherein the number of ground traces is greater than the number of electrical intersections between the ground traces.

11. An electrical mounting board comprising:
a substrate having a plurality layers configured such that a substrate core lies between the layers;
a first layer having a first portion and having a second portion, the layer having formed thereon,
a plurality of first ground traces and first signal traces arranged on the first portion of the first layer, the first ground traces extending parallel to a first axis defining first trace surfaces between the first ground traces, the first signal traces formed on the first trace surfaces between the first ground traces; and
a plurality of second ground traces and second signal traces arranged on the second portion of the first layer, the second ground traces extending parallel to a second axis that lies transverse to the first axis, the second ground traces defining second trace surfaces between the second ground traces, the second signal traces formed on the second trace surfaces between the second ground traces;
a second layer arranged below the first layer, the second layer including a third portion below the first portion of the first layer and a fourth portion below the second portion of the first layer, the second layer having formed thereon,
a plurality of third ground traces and third signal traces arranged on the third portion of the second layer, the third ground traces extending parallel to a third axis that lies transverse to the first axis, the third ground traces defining third trace surfaces between the third ground traces, the third signal traces formed on the third trace surfaces between the third ground traces;

a plurality of fourth ground traces and fourth signal traces arranged on the fourth portion of the second layer, the fourth ground traces extending parallel to a fourth axis that lies transverse to the third axis, the fourth ground traces defining fourth trace surfaces between the fourth ground traces, the fourth signal traces formed on the fourth trace surfaces between the fourth ground traces; and a set of electrically conductive interconnects that pass through the substrate core to electrically connect electrical ground traces of the first layer with electrical ground traces of the second layer to form a multi-layer ground grid having a plurality of ringlets.

12. An electronic device incorporating the board of claim 11.

13. The electronic device of claim 11 wherein the device comprises a computer.

14. The board of claim 11 wherein the electrical board comprises a two layer board wherein the first layer comprises a top layer of the board and wherein the second layer comprises a bottom layer of the board.

15. The board of claim 14 wherein electronic components are mounted on at least one of the first and second layers and electrically connected with the signal traces and electrically grounded to the ground traces of the board.

16. The board of claim 15 wherein the ringlets are located adjacent to the signal traces that electrically connect to the electronic components.

17. The board of claim 11 wherein the electrical board comprises a multi-layer board having at least three layers.

18. The board of claim 11 wherein ground traces of the first layer overlay ground traces of the second layer to form a multi-layer ground grid having a plurality of ringlets configured in substantially square arrangements.

19. The board of claim 11 wherein the ground traces of the first layer overlay the ground traces of the second layer to form a multi-layer ground grid having a plurality of ringlets configured in substantially diamond-shaped arrangements.

20. The board of claim 11 wherein the ground traces of the first layer overlay the ground traces of the second layer to form a multi-layer ground grid having a plurality of ringlets configured such that the density of the ringlets is associated with the electrical components mounted with the board.

21. The board of claim 11 wherein the signal traces are electrically connected with associated electronic components mounted on the board.

22. The board of claim 21 wherein the signal traces on the first layer and the second layer are arranged to accommodate the arrangement of the ground traces and the associated electronic components that are mounted on the board.

23. The board of claim 22 wherein electronic components include electromagnetic field sensitive components whose mode of operation is sensitive to variations in electromagnetic fields and wherein said plurality of ringlets are positioned underneath the electromagnetic field sensitive components to reduce the effects of undesirable electromagnetic emission.

24. The board of claim 23 wherein at least one of the electromagnetic field sensitive components comprises a track pad and wherein a plurality of the ringlets are positioned underneath the track pad.

25. The board of claim 11 wherein
the third ground traces of the second layer define third trace surfaces between the third ground traces and third signal traces are formed on the third trace surfaces between the third ground traces; and
the fourth ground traces of the second layer define fourth trace surfaces between the fourth ground traces and fourth signal traces are formed on the fourth trace surfaces between the fourth ground traces.

26. The board of claim 25 wherein
the first trace surfaces defined by the first ground traces comprise first elongate surfaces such that the a portion of the first signal traces extend parallel to the first ground traces;
the second trace surfaces defined by the second ground traces comprise second elongate surfaces such that the a portion of the second signal traces extend parallel to the second ground traces;
the third trace surfaces defined by the third ground traces comprise third elongate surfaces such that the a portion of the third signal traces extend parallel to the third ground traces; and
the fourth trace surfaces defined by the fourth ground traces comprise fourth elongate surfaces such that the a portion of the fourth signal traces extend parallel to the fourth ground traces.

27. An electrical mounting board comprising:
a substrate having a plurality layers configured such that a substrate core lies between the layers;
a first layer having formed thereon a plurality of electrical ground traces configured in at least two groups arranged in a hybrid configuration so that a first group of substantially parallel electrical ground traces is arranged in a transverse relationship with a second group of substantially parallel electrical ground traces;
a second layer having formed thereon a plurality of electrical ground traces configured in at least two groups arranged in a hybrid configuration so that a third group of substantially parallel electrical ground traces is arranged in a transverse relationship with a fourth group of substantially parallel electrical ground traces wherein the plurality of electrical ground traces of the first layer overlay the plurality of electrical ground traces of the second layer to form a multi-layer ground grid having a plurality of ringlets configured in substantially triangular arrangements;
a set of electrically conductive interconnects that pass through the substrate core to electrically connect electrical ground traces of the first layer with electrical ground traces of the second layer to form a multi-layer ground grid having a plurality of ringlets; and
signal traces formed on at least one of the first and second layers.

28. An electrical mounting board comprising:
a substrate having a plurality layers configured such that a substrate core lies between the layers;
a first layer having formed thereon
a plurality of electrical ground traces configured in at least two groups arranged in a hybrid configuration so that a first group comprises a first set of ground traces arranged in a first comb pattern of substantially parallel electrical first ground traces having a first and second end ground trace at each end of the comb pattern that are arranged in a transverse relationship with a second group comprising a second set of ground traces arranged in a second comb pattern of substantially parallel electrical second ground traces and wherein the first ground traces intersect with the second set of ground traces only at the first end ground trace of the second set of ground traces forming a first set of intersections;
- a second layer having formed thereon
  - a plurality of electrical ground traces configured in at least two groups arranged in a hybrid configuration so that a third group comprises a third set of ground traces arranged in a third comb pattern of substantially parallel electrical third ground traces having a first and second end ground trace at each end of the comb pattern that are arranged in a transverse relationship with a fourth group comprising a fourth set of ground traces arranged in a fourth comb pattern of substantially parallel electrical fourth ground traces and wherein the third ground traces intersect with the fourth set of ground traces only at the first end ground trace of the fourth set of ground traces forming a second set of intersections;
- a set of electrically conductive interconnects that pass through the substrate core to electrically connect the ground traces of the first layer with the ground traces of the second layer to form a multi-layer ground grid having a plurality of ringlets; and
- signal traces formed on at least one of the first layer and the second layer between the ground traces of the at least one of the first and second layers.

29. The board of claim 28 wherein the first layer is configured in at least three groups arranged in a hybrid configuration so that the first group and the second group include a further fifth group comprising a fifth set of ground traces arranged in a fifth comb pattern of substantially parallel electrical fifth ground traces, wherein the fifth group is arranged in a transverse relationship with the second group and wherein the fifth ground traces intersect with the second set of ground traces only at the second end ground trace of the second set of ground traces forming a third set of intersections; and wherein the second layer is configured in at least three groups arranged in a hybrid configuration so that the third group and the fourth group include a further sixth group comprising a sixth set of ground traces arranged in a sixth comb pattern of substantially parallel electrical sixth ground traces, wherein the sixth group is arranged in a transverse relationship with the fourth group and wherein the sixth ground traces intersect with the fourth set of ground traces only at the second end ground trace of the fourth set of ground traces forming a fourth set of intersections.

30. The board of claim 28 wherein the first layer is configured in at least three groups arranged in a hybrid configuration so that the first group and the second group include a further seventh group comprising a seventh set of ground traces arranged in a seventh comb pattern of substantially parallel electrical seventh ground traces, wherein the seventh group is arranged in a transverse relationship with the first group and wherein the first ground traces intersect with the seventh set of ground traces only at an end ground trace of the seventh set of ground traces forming a fifth set of intersections; and wherein the second layer is configured in at least three groups arranged in a hybrid configuration so that the third group and the fourth group include a further eighth group comprising a eighth set of ground traces arranged in a eighth comb pattern of substantially parallel electrical eighth ground traces, wherein the eighth group is arranged in a transverse relationship with the third group and wherein the third ground traces intersect with the eighth set of ground traces only an end ground trace of the eighth set of ground traces forming a sixth set of intersections.

\* \* \* \* \*

UNITED STATES PATENT AND TRADEMARK OFFICE
CERTIFICATE OF CORRECTION

PATENT NO.       : 7,129,416 B1
APPLICATION NO.  : 10/774053
DATED            : October 31, 2006
INVENTOR(S)      : Steinfeld et al.

It is certified that error appears in the above-identified patent and that said Letters Patent is hereby corrected as shown below:

Column 4, line 38, change "gird" to --grid--.

Column 8, line 16, change "patch" to --pitch--.

Column 8, line 35, change "gird" to --grid--.

Signed and Sealed this

Nineteenth Day of June, 2007

JON W. DUDAS
*Director of the United States Patent and Trademark Office*